(12) United States Patent
Van Dijk et al.

(10) Patent No.: US 7,340,663 B2
(45) Date of Patent: Mar. 4, 2008

(54) METHOD AND APPARATUS FOR EMBEDDING AN ADDITIONAL LAYER OF ERROR CORRECTION INTO AN ERROR CORRECTING CODE

(75) Inventors: Marten Erik Van Dijk, Cambridge, MA (US); Kouhei Yamamoto, Tokyo (JP); Masayuki Hattori, Tokyo (JP)

(73) Assignee: Koninklijke Philiops Electronics N.V., Eindhoven (NL)

( * ) Notice: Subject to any disclaimer, the term of this patent is extended or adjusted under 35 U.S.C. 154(b) by 392 days.

(21) Appl. No.: 10/509,475

(22) PCT Filed: Mar. 14, 2003

(86) PCT No.: PCT/IB03/01068

§ 371 (c)(1),
(2), (4) Date: Sep. 29, 2004

(87) PCT Pub. No.: WO03/085840

PCT Pub. Date: Oct. 16, 2003

(65) Prior Publication Data

US 2005/0229085 A1    Oct. 13, 2005

(30) Foreign Application Priority Data

Apr. 5, 2002  (EP)  .................... 02076354

(51) Int. Cl.
*H03M 13/00*    (2006.01)

(52) U.S. Cl. ...................... 714/755; 714/756; 714/761; 714/762

(58) Field of Classification Search ................ 714/755, 714/756, 761, 762
See application file for complete search history.

(56) References Cited

U.S. PATENT DOCUMENTS 4,336,612 A * 6/1982 Inoue et al. ................ 714/755
5,276,674 A * 1/1994 Tanaka ..................... 369/53.15

(Continued)

FOREIGN PATENT DOCUMENTS

WO     WO 9934271 A *  7/1999

OTHER PUBLICATIONS

M. Hattori, R.J. McEliece, G. Solomon "Subspace subcodes of Reed-Solomon codes", IEEE transactions on IT, vol. 44, No. 5, Sep. 1998.*

(Continued)

*Primary Examiner*—Joseph D. Torres

(57)  ABSTRACT

A method of embedding an additional layer of error correction into an error correcting code, wherein information is encoded into code words of said code over a first Galois field and wherein a number of code words are arranged in the columns of a code block comprising a user data sub-block and a parity data sub-block, provides an additional layer of error correction that can be easily implemented without losing compatibility improving the error correction capabilities. The method includes the steps of:
  encoding the rows of at least the user data sub-block separately or in groups using a horizontal error correcting code over a second Galois field larger than the first Galois field to obtain horizontal parities, and
  embedding the horizontal parities as additional layer in the error correcting code.

10 Claims, 7 Drawing Sheets

U.S. PATENT DOCUMENTS

| | | | | |
|---|---|---|---|---|
| 5,696,774 | A | * | 12/1997 | Inoue et al. ................. 714/755 |
| 5,712,861 | A | * | 1/1998 | Inoue et al. ................. 714/752 |
| 6,061,820 | A | * | 5/2000 | Nakakita et al. ............ 714/751 |
| 6,367,049 | B1 | | 4/2002 | Van Dijk et al. |
| 7,024,616 | B2 | * | 4/2006 | Ohira et al. ................. 714/786 |

OTHER PUBLICATIONS

Yuan D F et.al.: On performance of product codes and comparison with interleaved BCH codes in different mobile channels; pp. 619-621: Dec. 17, 1998; NJ USA;.

* cited by examiner

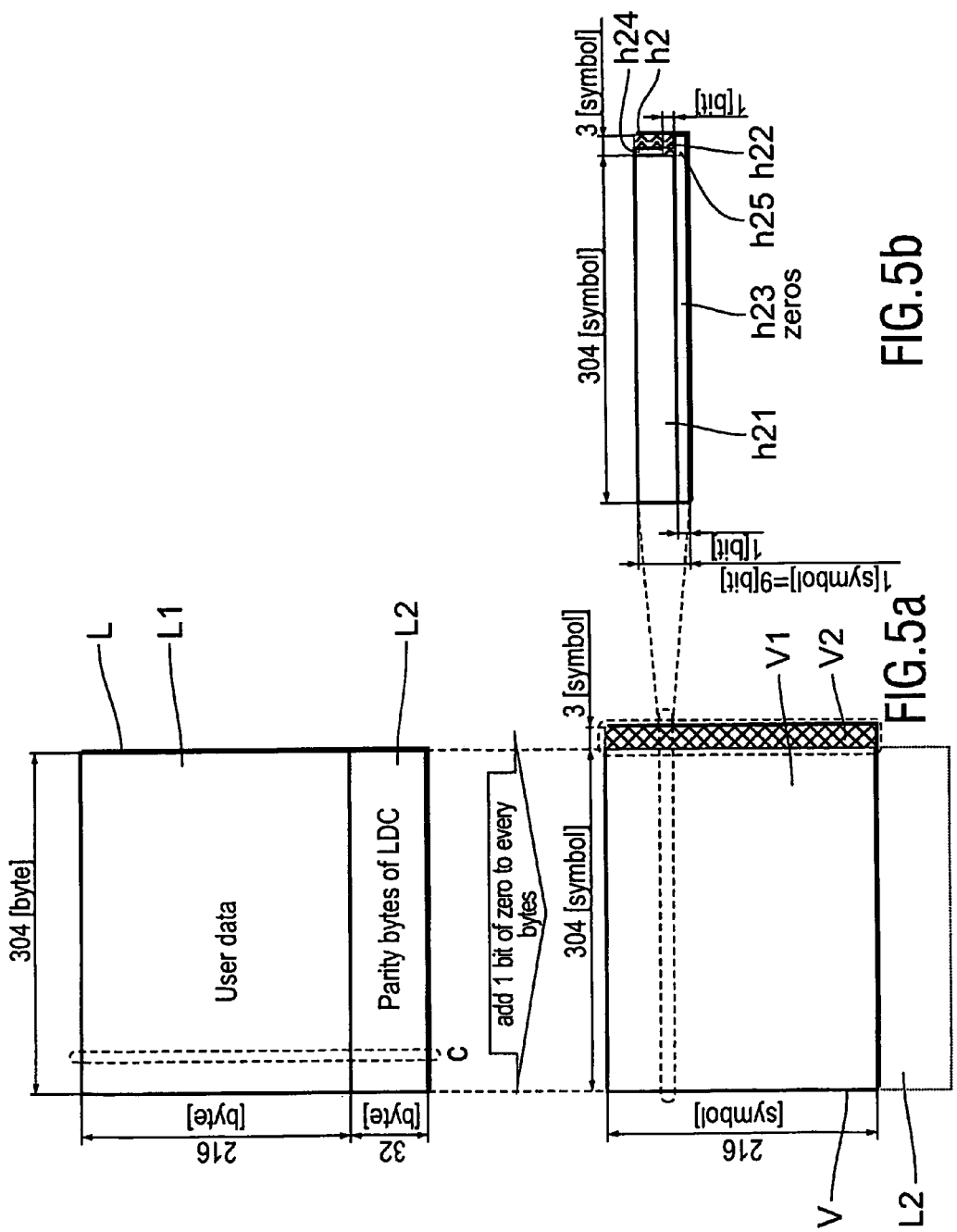

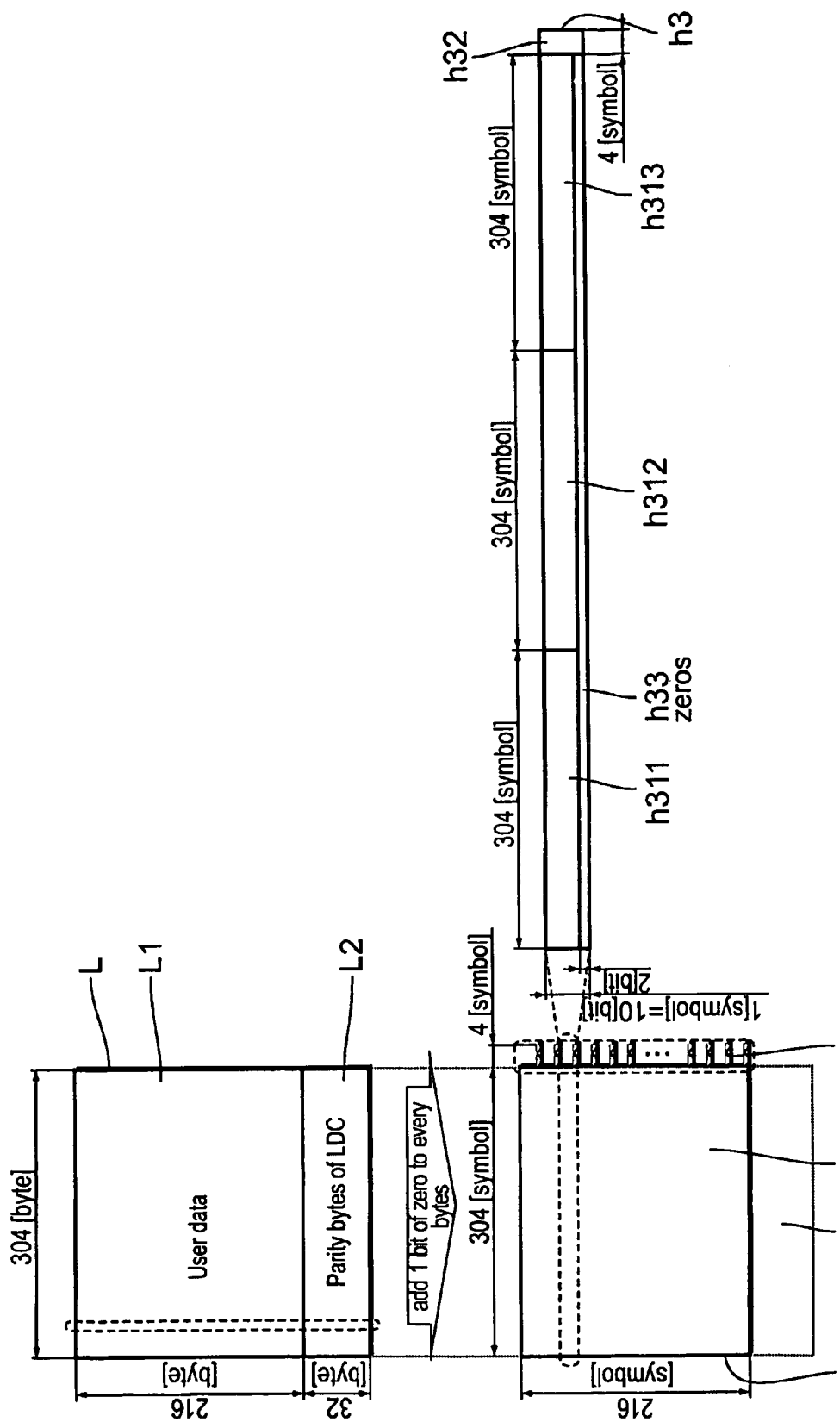

METHOD AND APPARATUS FOR EMBEDDING AN ADDITIONAL LAYER OF ERROR CORRECTION INTO AN ERROR CORRECTING CODE

BACKGROUND OF THE INVENTION

1. Field of the Invention

The invention relates to a method of embedding an additional layer of error correction into an error correcting code, wherein information is encoded into code words of said code over a first Galois field and wherein a number of code words are arranged in the columns of a code block comprising a user data sub-block and a parity data sub-block. The invention relates further to a method of decoding such an error correcting code, to corresponding apparatuses, to a storage medium storing code words of such a code, to a signal comprising such code words and to a computer program for implementing said methods.

2. Description of the Related Art

A method for encoding multiword information by wordwise interleaving is disclosed in International Patent Application No. WO 00/07300, corresponding to U.S. Pat. No. 6,367,049. Therein, a so-called picket code is described consisting of two types of code words, LDC (Long Distance Code) code words and BIS (Burst Indicator Subcode) code words, which is intended to be used for DVR (Digital Video Recording) for a storing data, particularly video data, on optical record carriers. The BIS code words provide large error correcting capabilities. Even under worst case circumstances, it is extremely unlikely that they cannot be decoded correctly. After the decoding of the BIS columns, bursts of errors can be recognized. After also applying an erasure strategy, the LDC code words, which have less error correcting capabilities, can be decoded correctly.

Compared to existing error correcting codes, e.g., the product code in DVD, the picket code improves the capability of correcting (multiple) burst errors. However, the picket code is less capable of correcting random errors.

SUMMARY OF THE INVENTION

It is therefore an object of the present invention to provide measures for improving the error correcting capabilities, particularly for correcting random errors, which can be easily implemented without losing compatibility with the current error correcting code scheme. Said measures shall be applicable to any error correcting code, particularly to the picket code used for DVR.

This object is achieved by a method comprising the steps of:

encoding the rows of at least said user data sub-block separately or in groups using a horizontal error correcting code over a second Galois field larger than said first Galois field to obtain horizontal parities, embedding said horizontal parities as additional layer in said error correcting code.

The present invention is based on the general idea to generate horizontal parities over code words which are arranged in the columns of a code block. Since the field size of said code block, i.e., the length of each row of said code block, is, in general, larger than the longest code over the first Galois field to which the code words in the columns of said code block belong, a code over a larger Galois field is used. The size of said larger Galois field is selected such that the length of the code words of the code over said larger Galois field is larger than the length of the rows of the code block for which the additional horizontal parities shall be generated. The generated horizontal parities can then be embedded in the original code as an additional layer for error correction. This additional layer can be used during decoding for correcting erasures, burst errors and decoding failures. Since the obtained horizontal parities are extra protected, a high level of error correcting capabilities can be achieved according to the invention.

The invention also relates to a method of decoding an error correcting code into which an additional layer of error correction is embedded according to the method of encoding as described above, said method comprising the steps of:

extracting said horizontal parities from said error correcting code, decoding the rows of at least said user data sub-block separately or in groups using the horizontal error correcting code, which had been used for encoding, over the second Galois field larger than said first Galois field using said horizontal parities.

Still further, the present invention relates to corresponding embedding and decoding apparatuses, to a storage medium storing data in form of code words of an error correcting code into which an additional layer of error correction is embedded, in particular to an optical record carrier, such as a CD, DVD or DVR disc, to a signal comprising data in form of code words of an error correcting code into which an additional layer of error correction is embedded, and to a computer program comprising program code means for causing a computer to implement the steps of the method for embedding and/or the method of decoding as described above, when said program is run on a computer.

For encoding the rows over a larger Galois field, a predetermined number of bits having a predetermined value is added to each symbol of the user data sub-block before encoding it. The easiest way is to add one bit having bit value zero to each symbol. However, any other bit value is generally also possible. It is further possible that bits having any bit value are added to each symbol, i.e., not all bits need to have the identical bit value. However, it is necessary to store the sequence of added bits to the symbols of one row since the identical sequence has to be added to each row. In this case, a register for storage of said sequence is required. When adding bits having bit value zero, however, no register is required for storage; in addition, less AND operations have to be performed.

Advantageously, the present invention is applied in a method using picket codes as particularly used in DVR where said code block is a LDC block comprising LDC code words, in particular, [248, 216, 33] code words over GF $(2^8)$, arranged in the columns of said LDC block and where BIS code words are used in addition, in particular, [62, 30, 33] Reed Solomon code words over GF $(2^8)$. Preferably, the obtained horizontal parities are encoded by an additional error correcting code, i.e., when using a picket code, said horizontal parities are preferably encoded and written in the BIS code words.

When applying the invention on picket codes, each row of the user data sub-block is preferably encoded separately using a [306, 304, 3] Reed Solomon (RS) code over a Galois field GF $(2^9)$. This means that one extra bit is added to each symbol of the user data sub-block, so that each symbol comprises 9 bits. As mentioned above, preferably one bit having bit value zero is added to each symbol. Using said code over GF $(2^9)$, two additional columns of horizontal parities are obtained.

According to another preferred embodiment, a Subspace Subcode of a Reed Solomon (SSRS) code is used for encoding the rows of the user data sub-block. Such Subspace Subcodes of Reed Solomon codes are particularly described in M. Hattori, R. J. McEliece, G. Solomon "Subspace subcodes of Reed-Solomon codes", IEEE transactions on IT, vol. 44, no. 5, September 1998. Such SSRS codes are codes in which specific bits of all symbols of all code words are always zero. Compared to usual Reed Solomon codes, less parity bits are required at the cost of additional user data bits. When applying such an SSRS code on a picket code, particularly a [307, 305, 3] SSRS code over a Galois field, GF ($2^9$) is used.

Further advantages can be achieved if not each row is encoded separately, but if the rows are encoded in groups of at least two rows, e.g., if three rows are first combined into one long row for which horizontal parities are obtained. Applied on picket codes, a [916, 912, 5] RS code over GF ($2^{10}$) is advantageously used, requiring the extension of each symbol by two additional bits, preferably having bit value zero.

In a still further preferred embodiment, the use of a SSRS code is applied to such groups of at least two consecutive rows, which even more leads to a reduction of the number of required horizontal parities. Particularly, in the application to picket codes, a [917, 913, 5] SSRS code over GF ($2^{10}$) is used.

BRIEF DESCRIPTION OF THE DRAWINGS

The present invention will now be explained more in detail with reference to the drawings, in which:

FIGS. 5a and 5b illustrate a second embodiment of an encoding method according to the invention, FIGS. 6a and 6b illustrate a third embodiment of an encoding method according to the invention.

DESCRIPTION OF THE PREFERRED EMBODIMENTS

Figure 1:
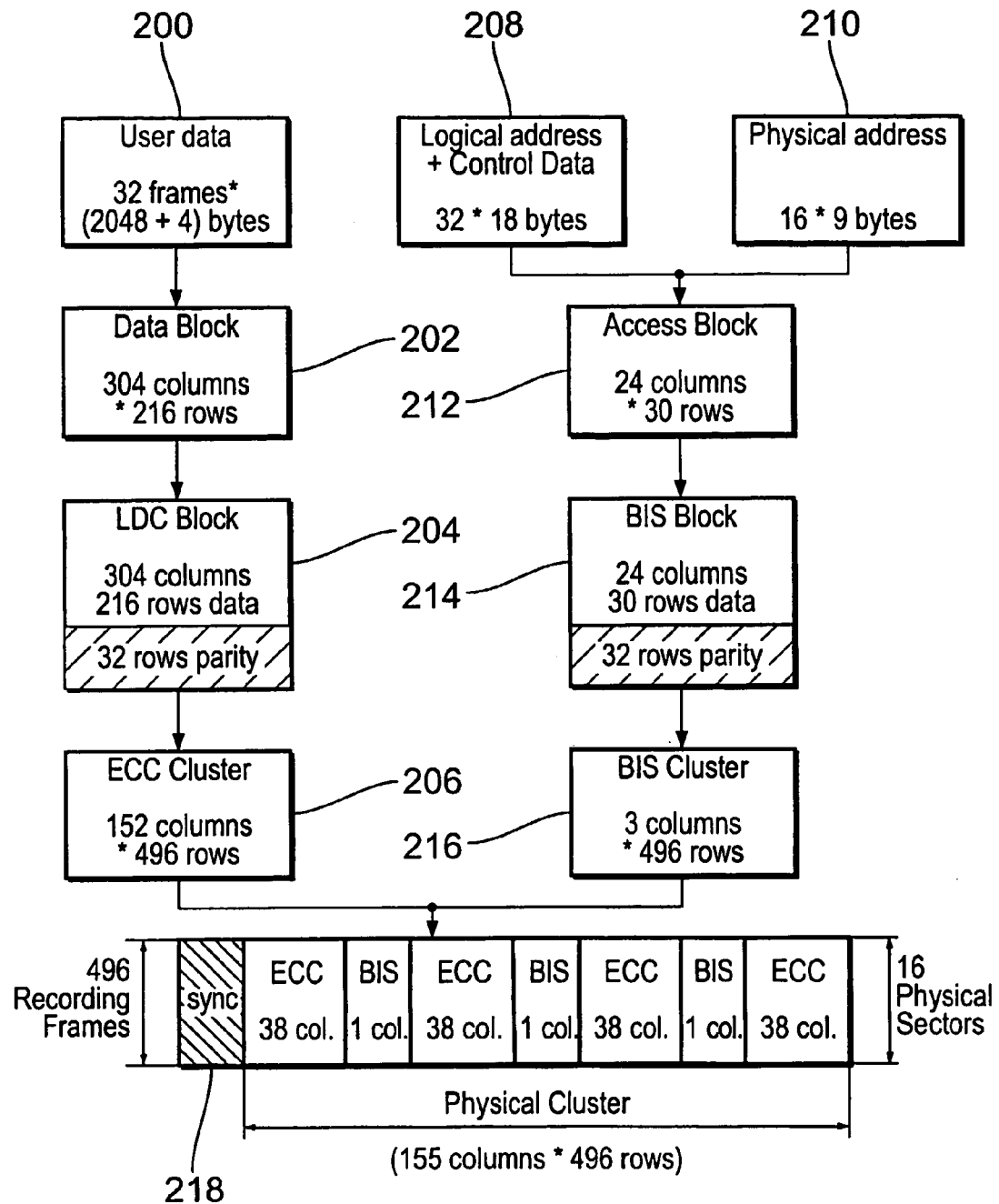
FIG. 1 shows a schematic representation of the encoding process of a picket code.

FIG. 1 shows a schematic representation of a method of encoding as it is described in International Patent Application No. WO 00/07300. The user data as received from a source that may be a host or an application, are first divided into data frames that each consists of 2048+4 bytes; as shown in block 200 of FIG. 1, 32 of these frames are taken into account for the next encoding step. In block 202, a data block is formed and arranged into 304 columns of 216 rows each. In block 204, a Long Distance Code (LDC) block is formed through adding 32 rows parity. In block 206, an ECC cluster is arranged according to 152 columns and 496 rows. This is arranged to fill the four sections labelled ECC in the physical cluster block 218, that is, the comprehensive code format NTT.

The address and control data added by a recording system are converted also in successive steps. First, the logical address and control data is arranged in 32×18 bytes in block 208. The logical addresses are those that pertain to use of functionalities, and may indicate aspects that relate to a duration of the rendering of a user program. Also, the physical addresses are arranged into 16×9 bytes in block 210. The physical addresses relayed to physical distances on a record carrier, such as an optical disc. Due to the repeated renumbering and interleaving, the relation between physical and logical addresses has been broken. Items that follow each other closely in a program, may be spaced from each other by an appreciable physical distance, and vice versa. Also, the mapping is not uniformly progressing. In block 212, the addresses are combined in an access block of 24 columns by 30 rows. In block 214, there are 32 rows of parity added. In block 216, these are arranged into a Burst Indicator Subcode (BIS) cluster of 3 columns and 496 rows. These fill the 3 BIS columns in block 218. Also, a column of sync bit groups is added, so that a physical cluster of 155 columns by 496 rows is formed. Together, these form 16 physical sectors that are grouped into 496 recording frames as shown.

The described error correcting code comprising LDC code words and BIS code words, is generally called picket code and is used in DVR technology. Regarding more details of said code, particularly, an encoding and decoding device for said code, the code format, the method of interleaving and mapping and the frame format, reference is made to International Patent Application No. WO 00/07300 which is herein incorporated by reference.

Figure 2:
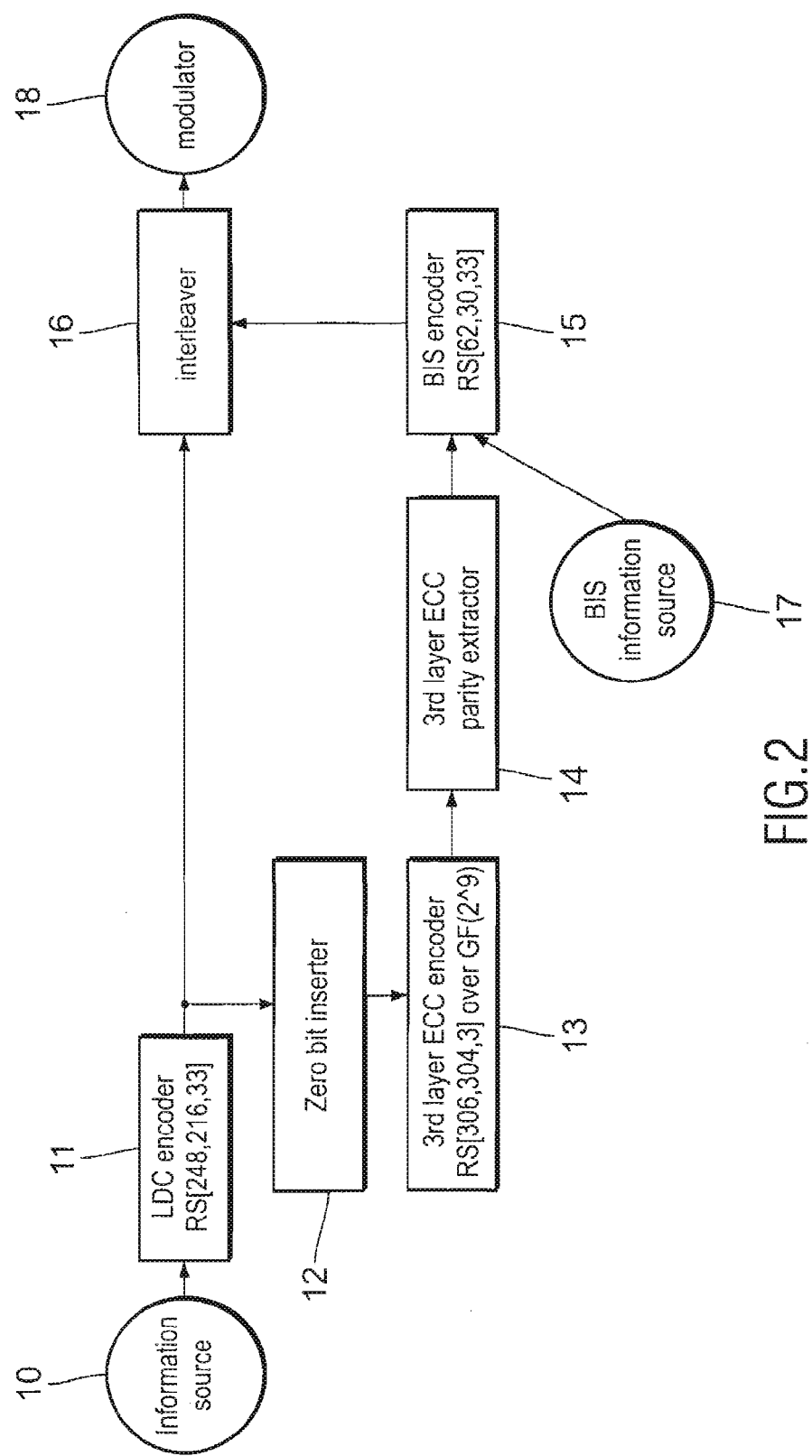
FIG. 2 shows a block diagram of an encoding apparatus according to the invention.
Figure 3:
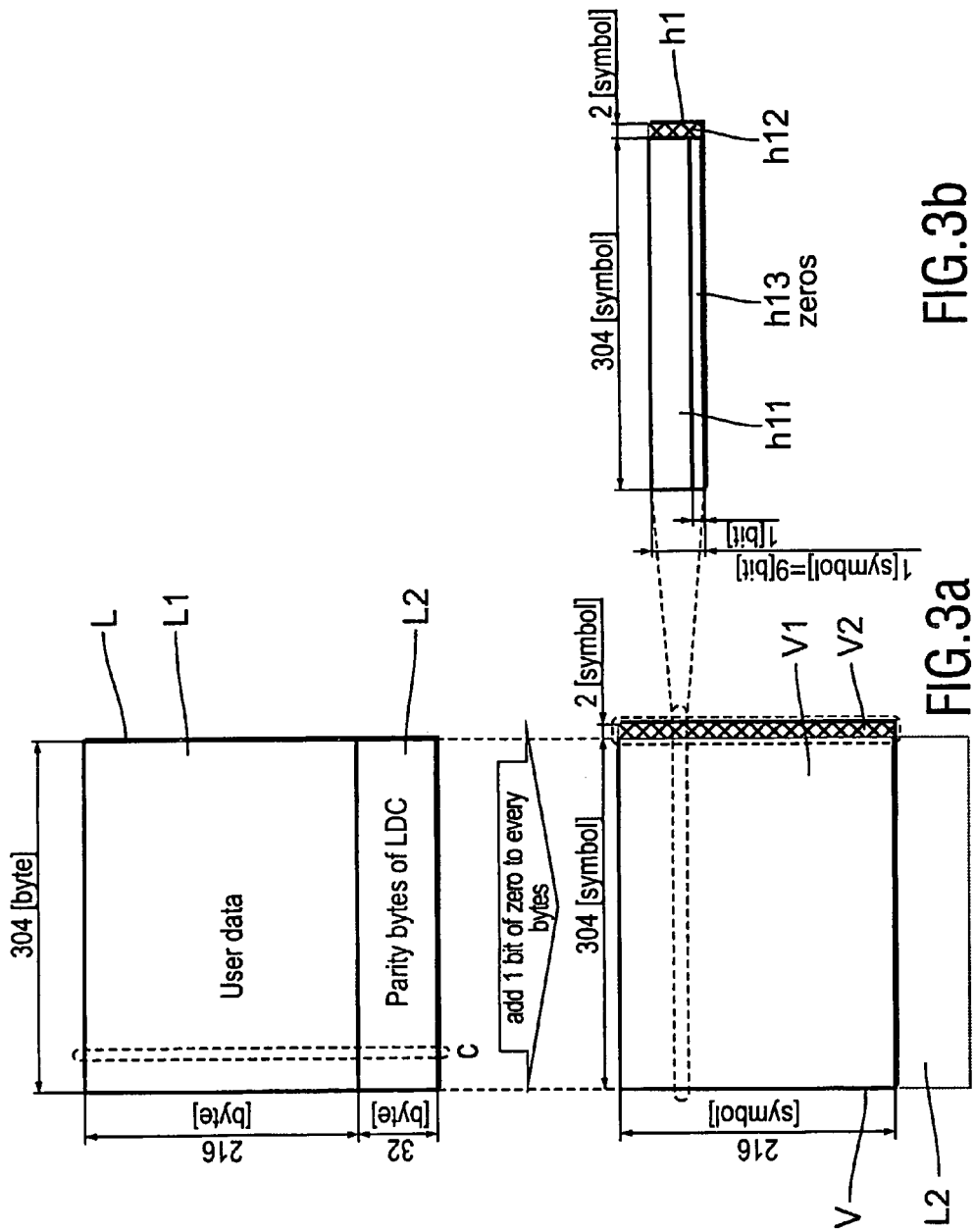
FIGS. 3a and 3b illustrate a first embodiment of an encoding method according to the invention.

A block diagram of an apparatus for encoding according to the present invention, particularly, for embedding a third layer of error correction into the picket code shown in FIG. 1 comprising the LDC and the BIS layer as two layers, is illustrated in FIG. 2. FIG. 3 illustrates the effect of the steps of this encoding method on the code. Using these figures, the embedding of an additional layer of error correction into the picket code shall be explained.

In a first step, user data coming from an information source 10, e.g., coming from a transmission channel, an application or a storage medium, are encoded into 304 LDC code words which are [248, 216, 33] Reed Solomon code words over a Galois field GF ($2^8$). This step of encoding is performed by an LDC encoder 11 resulting in a LDC block L comprising a user data sub-block L1 and a parity data sub-block L2. The LDC code words c each comprise 216 user data symbols and 32 parity symbols and are arranged in the columns of said LDC block L. Assuming random errors, it is the most probable case that only one of the 304 LDC code words c results in a decoder failure. To correct this decoder failure in LDC code words, the third layer of ECC is introduced. An RS code over GF ($2^8$) cannot be applied directly, since the length of the longest RS code over GF ($2^8$) is 255 which is smaller than the length of the rows of the LDC block L, which is 304. Therefore, according to the present invention, a Reed Solomon [306, 304, 3] code over GF ($2^9$) is employed as the third layer of ECC.

As illustrated in FIG. 3a, a matrix V1 is used for further encoding, wherein V1 corresponds to the user data sub-block L1 of the original code block L. By a bit inserter 12, one bit having bit value zero is added to each symbol of the matrix V1 so that each symbol, which originally comprised 8 bits, now comprises 9 bits of which the last bit has bit value zero. Subsequently, a third layer ECC encoder 13 encodes each row of the matrix V1 with a systematic RS [306, 304, 3] code over GF ($2^9$). Every row thus produces two parity symbols each comprising 9 bits. In total, two additional columns of parity symbols V2 are thus obtained.

A single horizontal code word h1 thus obtained is shown in FIG. 3b. Said code word h1 comprises the original (8 bit) symbols h11, the added zero bits h13 and the obtained two parity symbols h12 each comprising 9 bits.

The generated horizontal parity symbols V2 are thereafter extracted by a third layer ECC parity extracter 14 and are encoded and written in BIS code words by a BIS encoder 15 using a [62, 30, 33] RS code. This is possible since, in the current format of the picket code, 576 bytes in the BIS code words are undefined of which 486 (216×(2×9)/8) bytes are used for embedding said horizontal parities. The remaining information symbols for encoding are delivered from a BIS information source 17 to the BIS encoder 15. The rest of the current format of the picket code stays the same; the third layer only consists of the obtained 486 horizontal parity bytes.

In an interleaver 16, the BIS code words are finally interleaved into the LDC code words, as described in International Patent Application No. WO 00/07300, before the interleaved data stream is outputted to a modulator 18 for further processing. Since the third layer proposed, according to the present information, is compatible with the known error correction encoding and decoding scheme, a DVR player does not necessarily need to implement the decoding of said third layer.

Figure 4:
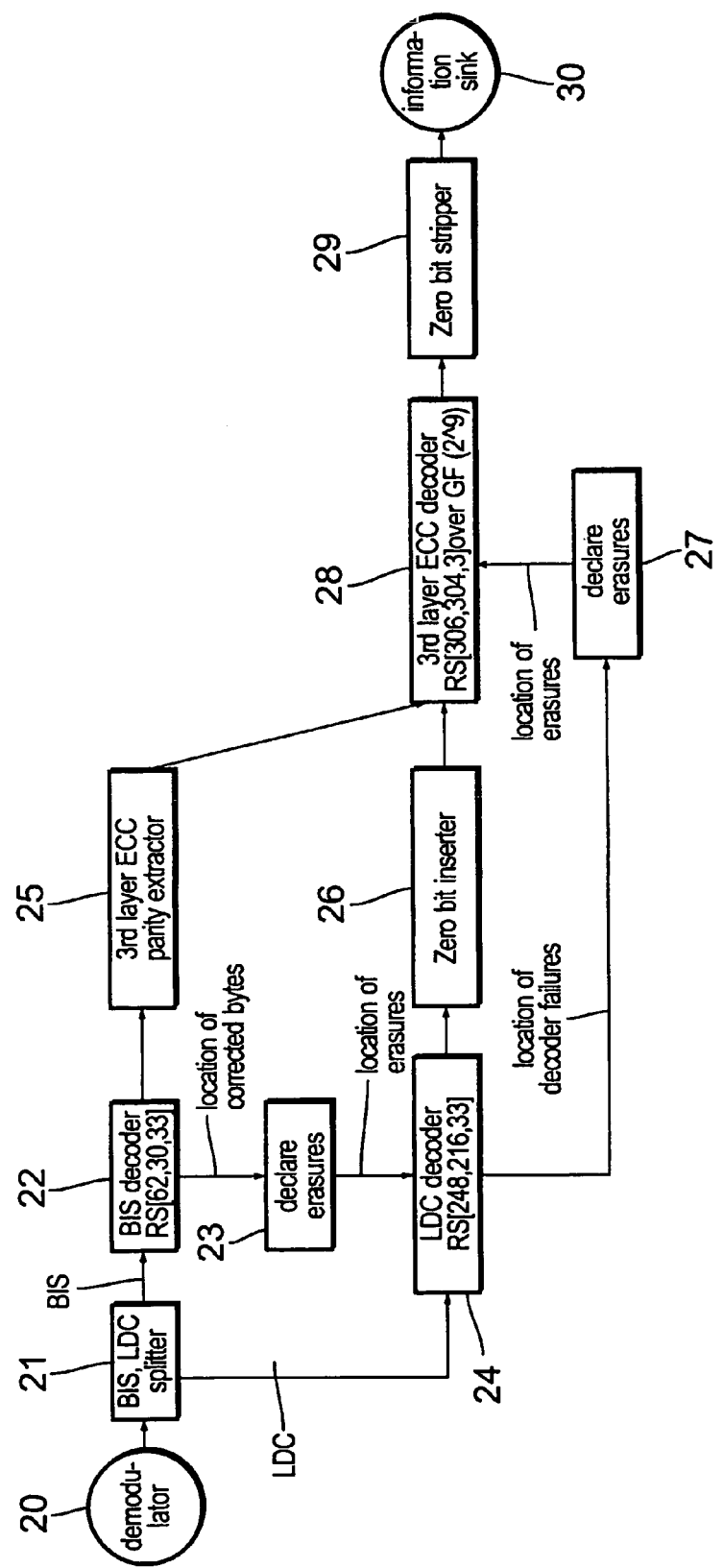
FIG. 4 shows a block diagram of a decoding apparatus according to the invention.

Decoding of the extended picket code comprising a third layer of error correction as described above will now be explained more in detail with reference to FIG. 4, which shows a block diagram of a decoding apparatus according to the present invention. The picket code is decoded by decoding the BIS code words, applying an erasure strategy and decoding the LDC code words. It will be explained in the following how the third layer embedded in the picket code according to the present invention provides protection against one or two decoding failures of LDC code words.

At first, from the data stream received from a demodulator 20 comprising the BIS code words and the LDC code words, the BIS code words are extracted by a BIS-LDC splitter 21, and the BIS code words are decoded first by a BIS decoder 22. Therein, errors-only decoding is applied. Since the BIS code words are protected with a very high error correction capability, it shall be assumed that all BIS code words are decoded correctly. Thus, the two parities of each of the 217 [219, 217, 3] RS code words of the matrix V shown in FIG. 3 are known. Further, this provides knowledge about burst errors because these affect neighboring BIS bytes, and this recognition leads to erasing LDC bytes where burst errors are suspected, i.e., erasures are declared in block 23. Now, the LDC code words are decoded by an LDC decoder 24 applying errors-and-erasures decoding, i.e., the code block L is reconstructed, which may include errors and erasures.

Next, for at least the user data sub-block L1, zero bits are inserted by a bit inserter 26 to extend each bit of said sub-block L1 by one bit. Thus, by a third layer ECC decoder 28, the obtained matrix V is decoded by an RS [306, 304, 3] code over GF $(2^9)$, using the horizontal parities extracted by a third layer ECC parity extracter 25 and using the knowledge of the location of erasures in the original code block L obtained from an erasure declaration unit 27. From the corrected matrix V obtained by said ECC decoder 28, the inserted zero bits are again cancelled from each symbol by a zero bit stripper 29 to obtain the user data sub-block L1 containing the user data which can be finally outputted to an information sink 30, e.g., an application or a transmission channel.

The third layer of ECC can correct some decoder failures and decoder errors in LDC code words as listed below:

a) 2 decoder failures and 0 decoder error in LDC code words: 2 erasures corresponding to the 2 decoder failures on every RS [306, 304, 3] code word are declared, and the RS [306, 304, 3] code words over GF $(2^9)$ are decoded with erasure-only decoding. Since a RS [306, 304, 3] code can correct 2 erasures, one can recover the 2 decoder failures.

b) 1 decoder failure and 0 decoder error in LDC code words: the RS [306, 304, 3] code words over GF $(2^9)$ are decoded with errors-only decoding. Since a RS [306, 304, 3] code can correct one error, one can recover the decoder failure.

c) 0 decoder failure and 1 decoder error in LDC code words: the RS [306, 304, 3] code words over GF $(2^9)$ are decoded with errors-only decoding. Since a RS [306, 304, 3] code can correct one error, one can recover the decoder error.

Another embodiment of a method of encoding according to the present invention is shown in FIG. 5a. Therein, a Subspace Subcode of a Reed Solomon (SSRS) code over GF $(2^9)$ is employed instead of a RS code over GF $(2^9)$. A SSRS code is a code in which some bits of all symbols of all code words are always zero, i.e., SSRS codes are linear subcodes of RS codes. For more details about such SSRS codes, reference is made to the above mentioned article of M. Hattori et al.

According to the embodiment shown in FIG. 5a, a SSRS [307, 305, 3] code over GF $(2^9)$ is constructed from the RS [306, 304, 3] code over GF $(2^9)$ by setting each last bit of all symbols of all code words to bit value zero including the parity symbols at the cost of one bit in one information symbol. This is illustrated in one horizontal code word h2 of the matrix V shown in FIG. 5b. Said code word h2 comprises the 304 information symbols h21 of the original user data sub-block L1 each comprising 8 bits, to each of which one bit having bit value zero (h23) is added. Further, said code word h2 comprises three additional symbols each comprising, as last bit h25, a bit having bit value zero, 17 parity bits h22 filling the two last 8-bit symbols plus one additional bit in the third last symbol. The remaining 7 bits h24 of the third last symbol remain empty.

Compared to RS [306, 304, 3] over GF $(2^9)$, SSRS [307, 305, 3] over GF $(2^9)$ needs less parity bits. SSRS [307, 305, 3] over GF $(2^9)$ needs 8×2+1=17 bits (due to setting all last bits including h25 to zero), whereas RS [306, 304, 3] over GF $(2^9)$ needs 9×2=18 bits. Since the matrix V comprises 216 SSRS [307, 305, 3] code words 1×216/8=27 bytes can be saved in total by replacing RS [306, 304, 3] over GF $(2^9)$ with SSRS [307, 305, 3] over GF $(2^9)$. Nevertheless, if SSRS [307, 305, 3] over GF $(2^9)$ is employed as the third layer of ECC, the same correctability will be achieved since the SSRS code over GF $(2^9)$ is a special class of RS codes over GF $(2^9)$.

A third embodiment of a method of encoding according to the present invention is shown in FIG. 6a. Therein, a larger field than GF $(2^9)$ is used to encode several consecutive rows in one code word. While in the first and the second embodiment one row of the matrix V forms one code word of RS [306, 304, 3] over GF $(2^9)$, a RS [916, 912, 5] over GF $(2^{10})$ enables the encoding of three rows into one code word.

To obtain a larger field not only one bit but two bits having bit value zero are added to each symbol of at least the user data sub-block L1 to obtain matrix V1'. By encoding each row, 4 additional columns of parity symbols V2' are obtained together forming matrix V'.

A single horizontal code word h3 is shown in FIG. 6b. Each code word h3 comprises three consecutive rows h311, h312, h313 of user data symbols, to each of which two bits h33 having bit value zero are added, and four symbols of 10 bits each of parities h32 obtained by encoding the three consecutive rows h311, h312, h313 including the added zeros h33.

Compared to RS [306, 304, 3] over GF ($2^9$), this code saves 126 parity bytes and has almost the same correctability. When using a similar decoder as shown in FIG. 4, one can correct only one decoder failure in LDC code words. One decoder failure corresponds to three erasures on RS [916, 912, 5] over GF ($2^{10}$) that can correct four erasures. However, if LDC code words are decoded again after the errors-only decoding of the third layer, one can recover two decoder failures or one decoder error in many cases, because the probability that error symbols remaining after LDC decoding are located at one code word of RS [916, 912, 5] over GF ($2^{10}$) is small when assuming random errors. Moreover, when the number of decoding iterations between LDC and the third layer is increased, better performance will be gained then one pass decoding.

According to a further alternative embodiment, it is possible to protect the whole 248 rows of the code block L, i.e., all rows of the user data sub-block L1 and the parity data sub-block L2, with RS [916, 912, 5] over GF ($2^{10}$) and decode the third layer and LDC iteratively. This will lead to a greater performance than protecting only the rows of the user data sub-block L1 at the cost of 54 extra parity bytes. In this alternative embodiment, the parity bytes of the LDC block L are also protected by the third layer, that is, parities on parities are generated and protected. The parities on parities provide a larger minimum distance of the whole extended picket code than 216 RS [916, 912, 5] over GF ($2^{10}$), because the third layer and the LDC forms a kind of product code as used in DVD. Generally speaking, the product code that has a large minimum distance will achieve good performance with iterative decoding. It should be noted that the general idea of this alternative embodiment, i.e., the encoding of the rows of the parity data sub-block L2 can be applied to any other embodiments as well.

Figures 7A, 7B:
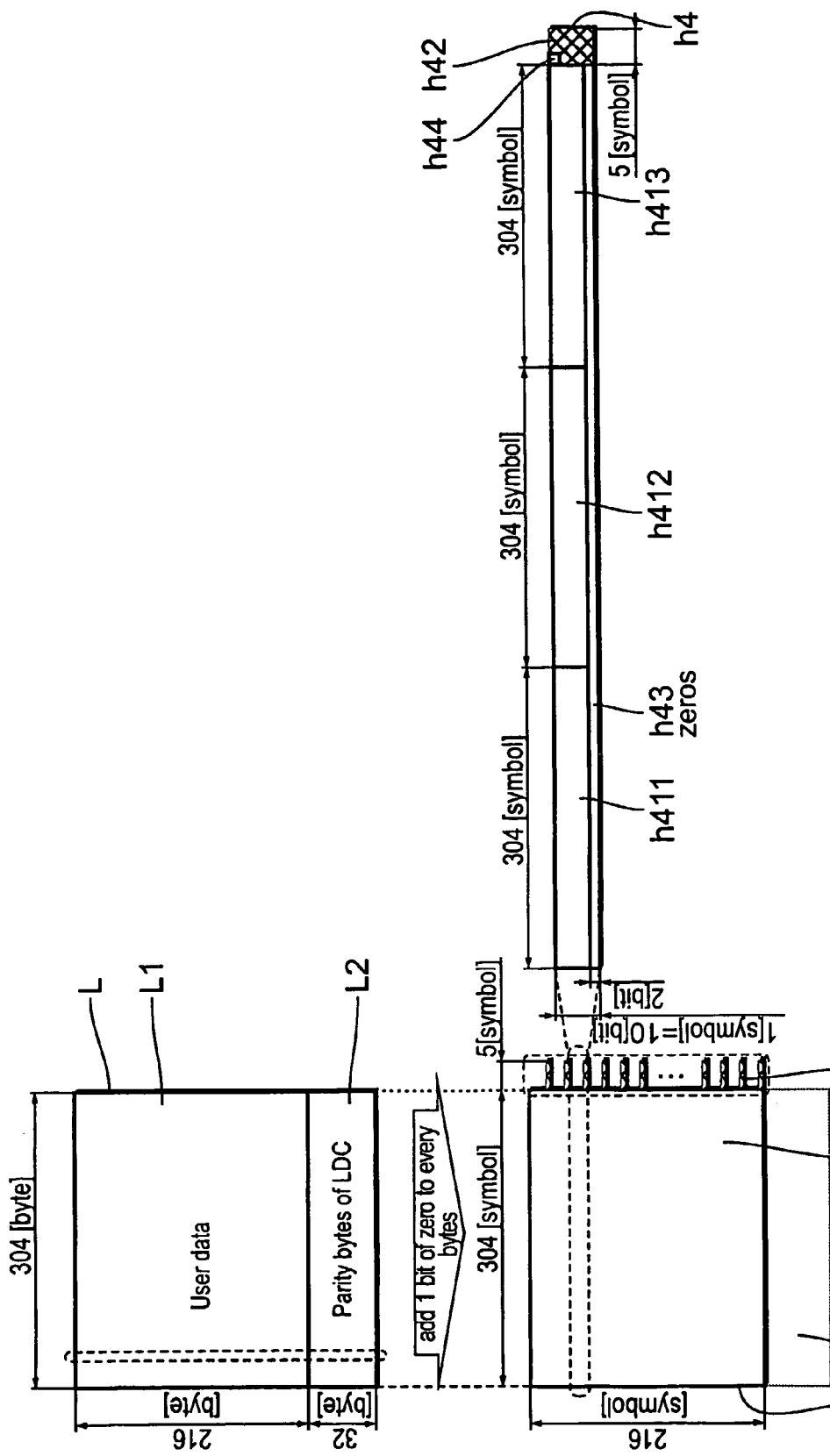
FIGS. 7a and 7b illustrate a fourth embodiment of an encoding method according to the invention.

A still further embodiment of an encoding method according to the present invention is shown in FIG. 7a. Said embodiment combines the two ideas of the second and third embodiments shown in FIGS. 5a and 6a, i.e., the SSRS code and the encoding of multiple rows per one code word. According to this embodiment, three consecutive rows of the matrix V1' are encoded simultaneously using a RS [917, 913, 5] code over GF ($2^{10}$) obtaining in total 38 parity bytes.

One such code word h4 is shown in FIG. 7b. It comprises three consecutive rows h411, h412, h413 of user data symbols to each of which two bits h43 having bit value zero are added, the obtained 38 parity bits h42 located in the last five symbols and two empty bits h44. Since the SSRS code is used, also the last two bits of the last five symbols of the code word h4 have been set to bit value zero.

If, in a further alternative embodiment, all 248 rows of the LDC block L are protected with SSRS [917, 913, 5] over GF ($2^{10}$), and if the third layer and the LDC are decoded iteratively, a greater performance will be gained than 216 SSRS [916, 912, 5] over GF ($2^{10}$) at the cost of 51 extra parity bytes.

In summary, the present invention enhances the correctability of random errors but keeps compatibility with the current error correcting code layout. It enables to choose a balance of redundancy and correctability and can be easily implemented by a decoder.

The invention claimed is:

1. In a method of encoding multiword information, which includes the steps of encoding information into first code words of an error correcting code over a first Galois field, and arranging a number of the first code words in columns of a code block comprising a user data sub-block and a parity data sub-block, wherein said code block comprises the first code words over the first Galois field arranged in the columns of said code block, a method of embedding an additional layer of error correction into the error correcting code, said method comprising the steps of:

adding bits of a predetermined number to the first code words to form second code words over a second Galois field arranged in the columns of said code block, wherein the bits have different bit values and comprise an identical sequence of bits added to each row;

encoding rows of at least said user data sub-block separately or in groups using a horizontal error correcting code over the second Galois field larger than said first Galois field to obtain horizontal parities; and embedding said horizontal parities as the additional layer in said error correcting code.

2. The method as claimed in claim 1, wherein the bits having a predetermined value is added to each symbol of said user data sub-block before encoding the rows of said user-data sub-block.

3. The method as claimed in claim 2, wherein one or two the bits having bit value zero are added to each symbol of said user data sub-block.

4. The method as claimed in claim 1, wherein said first Galois field is GF($2^8$), and wherein said code block is a Long Distance Code (LDC) block comprising LDC code words over the first Galois field GF($2^8$), arranged in the columns of said LDC block.

5. The method as claimed in claim 4, wherein in said encoding the rows step, each row of said user data sub-block is encoded separately using a [306, 304, 3] Reed Solomon code over a Galois field GF($2^9$).

6. The method as claimed in claim 4, wherein in said encoding the rows step, each row of said user data sub-block is encoded separately using a subspace subcode of a Reed Solomon code over a Galois field GF($2^9$).

7. The method as claimed in claim 4, wherein in said encoding the rows step, the rows of said user data sub-block are encoded in groups of three consecutive rows using a Reed Solomon code over a Galois field GF($2^{10}$).

8. The method as claimed in claim 4, wherein in said encoding the rows step, the rows of said user data sub-block are encoded in groups of three consecutive rows using a subspace subcode of a Reed Solomon code over a Galois field GF($2^{10}$).

9. The method as claimed in claim 1, wherein said horizontal parities are encoded by a Burst Indicator Subcode (BIS) comprising Reed Solomon code words over GF($2^8$).

10. An apparatus for embedding an additional layer of error correction into an error correcting code, wherein information is encoded into first code words of said code over a first Galois field, and wherein a number of the first code words are arranged in the columns of a code block comprising a user data sub-block and a parity data sub-block, wherein said code block comprises the first code words over the first Galois field arranged in the columns of said code block, said apparatus comprising:

means for receiving the error correcting code;

means for adding bits of a predetermined number to the first code words to form second code words over a second Galois field arranged in the columns of said code block, wherein the bits have different bit values and comprise an identical sequence of bits added to each row;

means for encoding the rows of at least said user data sub-block separately or in groups using a horizontal error correcting code over a second Galois field larger than said first Galois field, thereby forming at least horizontal parities;

means for embedding said horizontal parities as additional layer in said error correcting code; and means for outputting said modified error correcting code.

* * * * *